(12) United States Patent
Byers

(10) Patent No.: US 8,842,431 B2
(45) Date of Patent: Sep. 23, 2014

(54) HORIZONTAL CHASSIS HAVING FRONT TO BACK AIRFLOW

(75) Inventor: Charles C. Byers, Wheaton, IL (US)

(73) Assignee: Alcatel Lucent, Boulogne-Billancourt (FR)

( * ) Notice: Subject to any disclaimer, the term of this patent is extended or adjusted under 35 U.S.C. 154(b) by 1101 days.

(21) Appl. No.: 11/872,520

(22) Filed: Oct. 15, 2007

(65) Prior Publication Data

US 2009/0097204 A1    Apr. 16, 2009

(51) Int. Cl.
*G06F 1/20* (2006.01)
*H05K 7/20* (2006.01)

(52) U.S. Cl.
CPC .................................. *H05K 7/20572* (2013.01)
USPC ................. 361/679.49; 361/679.48; 361/695; 361/721; 361/727; 361/796; 312/223.2; 312/236; 454/184

(58) Field of Classification Search
USPC ............... 361/679.46–679.51, 690, 694–695, 361/719–720, 724–727, 788, 796–797, 803, 361/813; 165/80.3; 174/16.1, 252; 312/223.2, 236; 454/184–186
See application file for complete search history.

(56) References Cited

U.S. PATENT DOCUMENTS

| | | | | |
|---|---|---|---|---|
| 3,280,377 | A * | 10/1966 | Harris et al. ................... | 361/796 |
| 5,289,340 | A * | 2/1994 | Yoshifuji ...................... | 361/695 |
| 5,414,591 | A * | 5/1995 | Kimura et al. ................ | 361/695 |
| 5,497,288 | A * | 3/1996 | Otis et al. .................. | 361/679.46 |
| 5,663,868 | A * | 9/1997 | Stalley .......................... | 361/695 |
| 6,154,449 | A * | 11/2000 | Rhodes et al. ................. | 370/254 |
| 6,324,056 | B1 * | 11/2001 | Breier et al. ............. | 361/679.46 |
| 6,512,672 | B1 * | 1/2003 | Chen ............................. | 361/695 |
| 6,754,757 | B1 * | 6/2004 | Lewis ........................... | 710/301 |
| 7,050,301 | B2 * | 5/2006 | Wong et al. ................... | 361/695 |
| 7,085,133 | B2 * | 8/2006 | Hall .............................. | 361/695 |
| 7,173,817 | B2 * | 2/2007 | Wei ......................... | 361/679.48 |
| 7,280,353 | B2 * | 10/2007 | Wendel et al. ........... | 361/679.33 |
| 7,280,356 | B2 * | 10/2007 | Pfahnl et al. .................. | 361/695 |
| 7,542,288 | B2 * | 6/2009 | Lanus .......................... | 361/695 |
| 2005/0264995 | A1 * | 12/2005 | Hanson ........................ | 361/695 |
| 2006/0126292 | A1 * | 6/2006 | Pfahnl et al. ................. | 361/695 |
| 2007/0230118 | A1 * | 10/2007 | Leija et al. .................... | 361/690 |
| 2008/0192454 | A1 * | 8/2008 | Knutsson ...................... | 361/796 |
| 2010/0091458 | A1 * | 4/2010 | Mosier et al. ................. | 361/695 |
| 2012/0201001 | A1 * | 8/2012 | Aoki et al. .................... | 361/690 |
| 2012/0201003 | A1 * | 8/2012 | Shimasaki et al. ............ | 361/695 |

FOREIGN PATENT DOCUMENTS

WO    WO 2006104431 A1 *   10/2006    ............. H05K 7/14

* cited by examiner

*Primary Examiner* — Robert J Hoffberg
(74) *Attorney, Agent, or Firm* — Hitt Gaines, PC

(57) ABSTRACT

Provided is an apparatus, a system, and a method for operating the same. The apparatus, in one embodiment, includes a chassis having a front configured to accept one or more circuit boards, a back, and first and second sides. The apparatus, in this embodiment, further includes one or more slots located within the chassis, each slot configured to receive one of the circuit boards at an angle with respect to the first and second sides. The slots, in this embodiment, at least partially define a first plenum opening to the front and a second plenum opening to the back. The apparatus additionally includes a fan assembly coupled to one of the first plenum or the second plenum.

24 Claims, 4 Drawing Sheets

HORIZONTAL CHASSIS HAVING FRONT TO BACK AIRFLOW

TECHNICAL FIELD

The present disclosure is directed, in general, to heat dissipation and, more specifically, to the heat dissipation of circuit boards in modular electronic systems.

BACKGROUND

Modular electronic packaging has recently come under the jurisdiction of international standards, in one instance Advanced Telecommunications Architecture (also referred to as AdvancedTCA). Telecommunications network equipment manufacturers can gain many benefits by using these standards as the basis for their modular platforms. However, these standards are not always optimal in important dimensions, for example scalability, modularity, density, power handling capacity and cost. Innovative packaging options are often the key to successful system deployments.

Since being ratified, many manufacturers have built products based upon the AdvancedTCA standard. At the highest level, the standard consists of a number of boards plugged into a chassis that contains an interconnect backplane, power distribution, and cooling elements. Traditional AdvancedTCA systems arrange 14-16 boards vertically across a chassis. As there is often a system or wire center level requirement for front to back airflow, cooling air generally enters the chassis from the bottom front, blows up through the boards, and exits through the top rear. Typical vertical chassis's have two central fabric boards to provide system interconnect, and 12-14 node boards providing control computing, packet processing, signal processing, storage, and I/O functions.

For some applications, 14 boards are too large of a system. These applications are better served with a smaller number of node boards, typically 2-6. Unfortunately, arranging only a handful of boards in the vertical orientation, as in the larger chassis, wastes substantial rack space in unused board slots. For these systems, horizontal chassis are often used. The horizontal configuration rotates the collection of boards 90 degrees counterclockwise. Airflow in such a system, because of certain constraints, is typically right to left (or vice versa). Unfortunately, problems exist with the right to left airflow used.

Accordingly, what is needed in the art is an apparatus or system configured to accommodate the use of horizontal chassis that does not experience the problems that currently exist.

SUMMARY

To address the above-discussed deficiencies, provided is an apparatus, a system, and a method for operating the same. The apparatus, in one embodiment, includes a chassis having a front configured to accept one or more circuit boards, a back, and first and second sides. The apparatus, in this embodiment, further includes one or more slots located within the chassis, each slot configured to receive one of the circuit boards at an angle with respect to the first and second sides. In this embodiment, the slots at least partially define a first plenum opening to the front and a second plenum opening to the back. In one embodiment, the plenums are approximately triangular prismatic in shape. The apparatus additionally includes a fan assembly coupled to one of the first plenum or the second plenum.

The system, in one embodiment, includes an installation site including a frame. The frame, in this embodiment, includes both a horizontal apparatus and a vertical apparatus. The horizontal apparatus, in one embodiment, includes: 1) a horizontal chassis having a front, a back, and first and second sides, 2) one or more horizontal slots located within the horizontal chassis, 3) one or more horizontal circuit boards located in associated ones of the one or more horizontal slots, each horizontal slot positioning one of the horizontal circuit boards at an angle with respect to the first and second sides, wherein the horizontal slots and horizontal circuit boards at least partially define a first plenum opening to the front of the horizontal chassis and a second plenum opening to the back of the horizontal chassis; and 4) a horizontal chassis fan assembly coupled to one of the first plenum or the second plenum. The vertical apparatus, in one embodiment, includes: 1) a vertical chassis, 2) one or more vertical slots located within the vertical chassis, 3) one or more vertical circuit boards located within associated ones of the one or more vertical slots, and 4) a vertical chassis fan assembly coupled to the vertical chassis.

The method for operating the system, in one embodiment, includes providing a horizontal apparatus, for example such as discussed in the paragraphs above. The method additionally includes operating the fan assembly of the horizontal apparatus to move airflow into the first plenum, over the one or more horizontal circuit boards, and out of the second plenum.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

The present disclosure is based, at least in part, on the acknowledgement that standard horizontal chassis have certain inherent problems. One such problem is the inability to intake and exhaust cooling air via the front and back of the chassis/frame, as is desired in the industry. For example, the present disclosure acknowledges that space limitations associated with the horizontal chassis and the associated frame as used in typical installations, at least heretofore the present disclosure, limited the chassis to the use of side to side cooling. The present disclosure further acknowledges that air deflectors, located outside the frame to prevent frames from drawing hot exhaust air from the adjacent frame into their cool air inlets, have inherent problems also.

Based upon the foregoing acknowledgements, as well as substantial analysis, the present disclosure recognizes that front to back cooling (or vice versa) of the circuit boards may be achieved in horizontal chassis by rotating the circuit boards such that they are not parallel with the sides of the chassis. For example, by rotating the circuit boards about an axis normal to the component side of the circuit board within the horizontal chassis, a front plenum opening to the front of the chassis and a second plenum opening to the back of the plenum may be achieved. Moreover, the rotating of the circuit boards allow a fan assembly to be coupled to one or both of the front or back of the chassis, and thus coupled with adequate cross-sectional area for the desired flow to one or both of the first and second plenums. Accordingly, contrary to existing beliefs in the industry, front to back cooling (or vice versa) can be achieved in horizontal chassis, including those that already conform to 23 inch or 600 mm existing frame structures.

Figure 1:
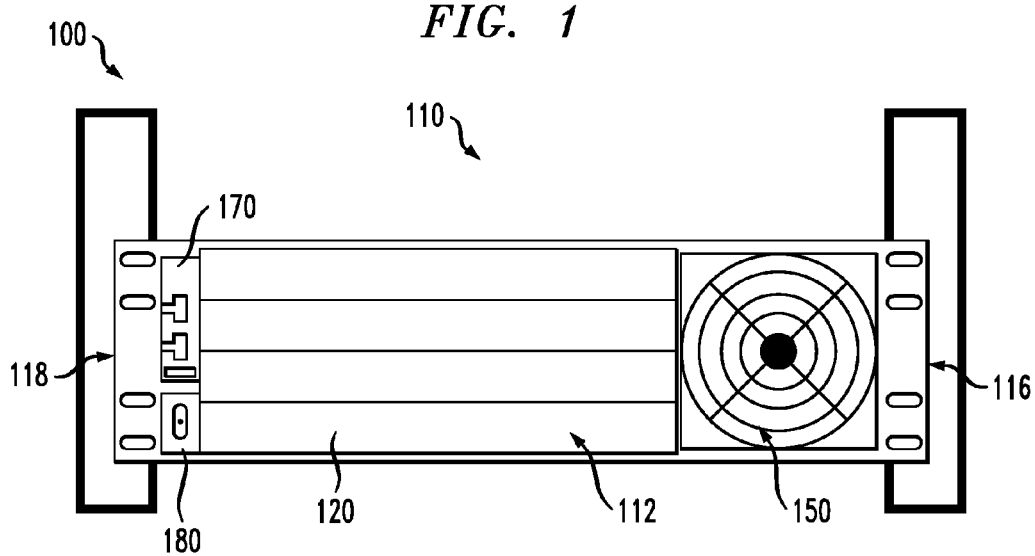
FIGS. 1 and 2 illustrate different views of an apparatus manufactured in accordance with the disclosure.
Figure 2:
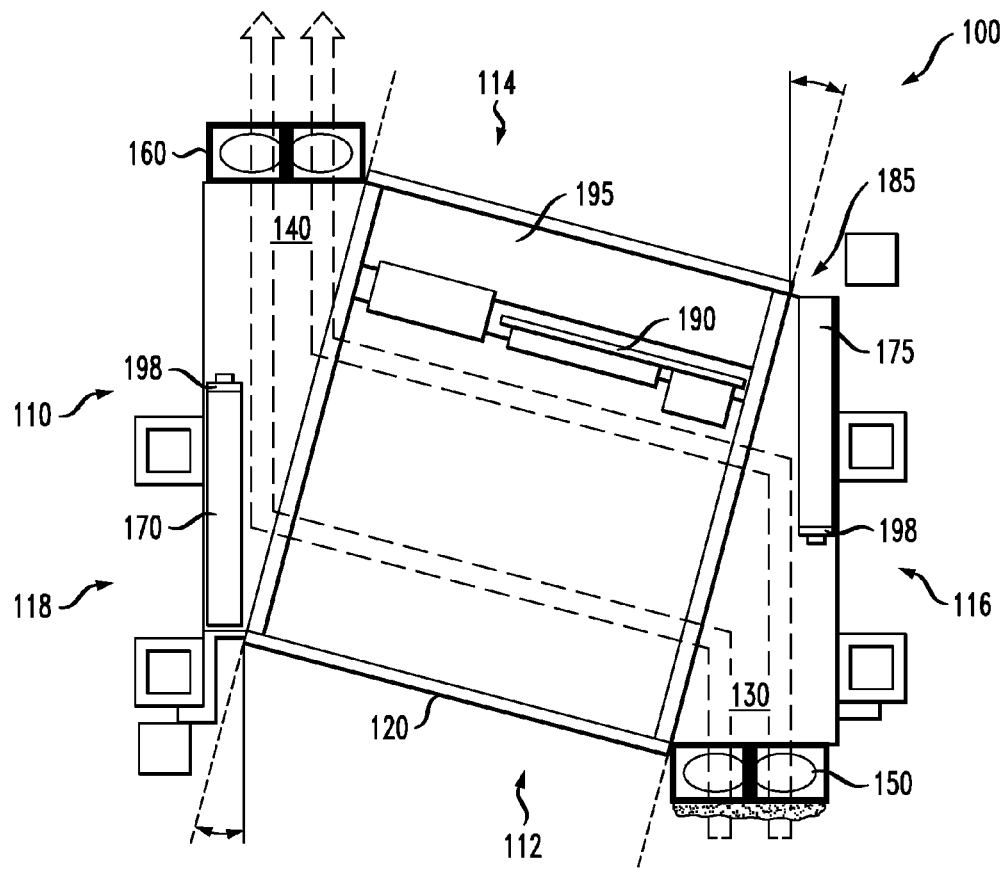

FIGS. 1 and 2 illustrate an apparatus 100 manufactured in accordance with the disclosure. FIG. 1 illustrates a front view of the apparatus 100, whereas FIG. 2 illustrates a top view. As is illustrated in FIGS. 1 and 2, the apparatus 100 includes a chassis 110 (e.g., shelf). The chassis 110 may be any chassis including one or more slots configured to hold one or more circuit boards (i.e., an electronic subassembly typically comprised of a printed wiring board with electrical or mechanical mounted components and backplane connections, including node boards, RTMs, etc.), including a chassis designed and manufactured in accordance with the AdvancedTCA standard. The chassis 110 of FIGS. 1 and 2 has a front 112 configured to accept one or more circuit boards, as well as a back 114, first side 116 and second side 118.

The chassis 110 may comprise different sizes, including different widths and heights. In one example embodiment the chassis 110 is configured to cooperate with a 23 inch or 600 mm universal network frame, and thus would have a width (w) that would allow it to removably attach to one of such frames. In another example embodiment, the height of the chassis 110 varies using rack units (U). A rack unit (U), as used in this disclosure, is a value of about 1.75 inches or about 44.45 millimeters. Accordingly, the height of the chassis 110 may be based upon any whole number of rack units (U), and other apparatus mounted in it are typically packaged in height increments of 1 U. In the example embodiment of FIGS. 1 and 2, the chassis 110 is a 3 U chassis. This is true even though the chassis 110 includes a greater number of circuit boards (e.g., 4) than associated rack units (e.g., 3). In fact, typical AdvancedTCA horizontal chassis designs as known in the art to have fewer board slots per U of rack space.

The apparatus 100 further includes one or more slots located within the chassis 110. The term slot, as used in this disclosure, should not be limited to any specific physical structure, as a slot may be any location within the chassis 110 configured to hold a circuit board 120. In one example embodiment, each circuit board 120 is positioned within a slot, each circuit board 120 mating with a backplane of the chassis 110, and being fixed within that specific slot using one or more fasteners (e.g., latches, levers, bolts, screws, clips, etc.) on the front or back side of the chassis 110. In an alternative embodiment, the chassis 110 includes one or more rails configured to precisely position each circuit board 120 within each slot. This embodiment may additionally use the one or more fasteners to fix the circuit boards 120 within the one or more slots. Other embodiments for positioning the circuit boards 120 within the slots also exist.

Each of the slots, in this embodiment, is configured to receive an associated circuit board 120. For example, in accordance with the disclosure, each of the slots receives an associated circuit board 120 at an angle ($\theta$) with respect to the first and second sides. The term angle, as used throughout this disclosure, means any positive or negative number, whether a whole number or not, excluding the value of zero. Accordingly, a measurement of zero degrees is not an angle, as defined herein.

The specific value of the angle ($\theta$) is governed by certain criteria. For example, the higher limit of the angle ($\theta$) is at least partially governed by the need to still be able to remove the circuit board 120 from the chassis 110. Too great of an angle ($\theta$) might prevent the circuit board 120 from being placed within and/or removed from the chassis 110, for example because of potential collisions with mechanical components like frame uprights as the circuit boards 120 are inserted or withdrawn. Moreover, the lower limit of the angle ($\theta$) is at least partially governed by the need to create a large enough plenum. Accordingly, the angle ($\theta$), in one example embodiment, is about 15 degrees or less. The angle ($\theta$), in another example embodiment, ranges from about 10 degrees to about 15 degrees.

As illustrated in FIGS. 1 and 2, the slots and/or circuit boards 120 at least partially define a first plenum 130 and a second plenum 140. The first plenum 130, in the example embodiment shown, opens to the front of the chassis 110, wherein the second plenum 140, in the example embodiment shown, opens to the back of the chassis 110. Both the first and second plenums 130, 140, at least in this embodiment, substantially take the shape of a right triangular prism. Obviously, the size of the first and second plenums 130, 140, is at least partially a function of the angle ($\theta$) of rotation of the circuit boards 120 within the chassis 110.

The apparatus 100 of FIGS. 1 and 2 further includes a fan assembly coupled (e.g., removably coupled) to one of the first or the second plenums 130, 140. For example, in the example embodiment shown, a first fan assembly 150 is coupled to the first plenum 130, and located on the front of the chassis 110. Likewise, in the example embodiment shown, a second fan assembly 160 is coupled to the second plenum 140, and located on the back of the chassis 110. Nevertheless, certain embodiments exist wherein only the first fan assembly 150 is used, only the second fan assembly 160 is used, or as shown in FIGS. 1 and 2, both the first and second fan assemblies are used 150, 160.

In the example embodiment shown, the first fan assembly 150 is configured to push airflow over the one or more circuit boards 120 and RTMs 195 while the second fan assembly 160 is configured to pull airflow over the one or more circuit boards 120 and RTMs 195. This type of system is often referred to as a push/pull type cooling system. Accordingly, the first plenum 130 is an intake plenum, and the second plenum 140 is an exhaust plenum. If the first fan assembly 150 were only used, as discussed briefly above, it might be considered a push type cooling system. Alternatively, if the second fan assembly 160 were only used, as discussed briefly above, it might be referred to as a pull type cooling system.

The fan assemblies 150, 160 in accordance with the disclosure, include any device configured to move air. In the example embodiment of FIGS. 1 and 2, the fan assemblies 150, 160 each include single axial fans. For example, each of the axial fans in the embodiment of FIGS. 1 and 2 is about a 120 mm to about 130 mm axial fan. The fan assemblies 150, 160 might also include one or more cross flow fans or centrifugal blowers (each of which are configured to move air), as opposed to axial fans.

The apparatus 100 additionally includes a first shelf manager 170 and a second shelf manager 175. The shelf managers 170, 175, in accordance with the disclosure, are configured to manage the operation of all elements in the chassis 110. The management operations include control of configuration, monitoring of internal conditions, power sequencing, and human machine interface, among others. The first shelf manager 170, in the embodiment shown, is located on the front of the chassis 110 distal the first fan assembly 150. For example, it is located on an opposing side of the circuit boards 120 as the first fan assembly 150. Similarly, the second shelf manager 175, in the embodiment shown, is located on the back of the chassis 110 distal the second fan assembly 160.

The apparatus 100 additionally includes a first power entry module 180 and a second power entry module 185. The power entry modules 180, 185, in accordance with the disclosure, are configured to accept, protect, and distribute the input power to the other elements of the system, among other purposes. Because the power entry modules 180, 185 are obscured by the first and second shelf managers 175, their exact location is difficult to observe in FIGS. 1 and 2. Nevertheless, the first power entry module 180, in the embodiment shown, is located on the front of the chassis 110 distal the first fan assembly 150 and below the first shelf manager 170. Similarly, the second power entry module 185, in the embodiment shown, is located on the back of the chassis 110 distal the second fan assembly 160 and below the second shelf manager 175.

As those skilled in the art are aware, the apparatus 100 may further include a backplane 190. The backplane 190 may be similar to any backplane currently used in an electronics chassis, including a backplane designed and manufactured in accordance with the AdvancedTCA standard. The backplane 190, in accordance with the disclosure, is configured to mate with the circuit boards 120 that are rotated at the angle ($\theta$). Additionally, the backplane 190 in the embodiment of FIGS. 1 and 2 is coupled to a rear transition module (RTM) 195. The RTM 195 is a small circuit board configured to provide I/O cable terminations or other functions, and may also be similar to any RTM currently used in an electronics chassis, including an RTM designed and manufactured in accordance with the AdvancedTCA standard.

The apparatus 100 of FIGS. 1 and 2 additionally includes module backplanes 198. Each of the module backplanes 198 are configured to detachably mate with the first and second shelf managers 170, 175, as well as with the first and second power entry modules 180, 185. Additionally, connectors may be coupled to the backplane 190 and module backplanes 198 to provide connectivity therebetween. The first and second fan assemblies 150 and 160 may also connect to module backplanes 198.

The apparatus 100 of FIGS. 1 and 2 may include additional features not illustrated. For instance, the apparatus 100 may include small servo-mechanism controlled air dampers installed within one or more air paths to be managed (e.g., air paths created by the circuit boards 120 or even air paths within ones of the circuit boards 120). In this embodiment, the servo dampers, allocate (e.g., dynamically) a portion of the airflow created by the fan assemblies 150, 160 to associated air paths. In one example embodiment, if temperature sensors (e.g., mounted in major chips like microprocessors, or in exhaust streams) sense that the components in that path are running hot, an actuator causes a damper to open by a predictable, controlled amount, allowing more air through that specific air path. Similarly, if a component is running cool enough, but other air paths are demanding more air, the corresponding damper may be commanded to slightly close that air path, which causes more air to flow through the alternative air paths where it is needed. Additionally, the airflow generated by the fan assemblies 150, 160 may be adjusted to the appropriate level (e.g., by throttling the fan up or down to provide the needed amount of airflow) after the dampers find their optimal position. Accordingly, the servo dampers may cause the air paths in the system to each have exactly enough restriction (e.g., not too much or too little) to permit balanced cooling over the entire system.

In accordance with this disclosure, the one or more servo dampers, as well as the output of the fan assembly, may be adjusted either manually or automatically (e.g., through the use of manual or automatically generated control commands provided to the servo dampers or fan assembly), depending on the application. For instance, in one example embodiment the servo dampers may react automatically to rebalance the airflow across the system, without human intervention, if the system's configuration changes (e.g., because a cooling fan fails, different boards or mezzanines are installed, one or more circuit boards are running at elevated temperatures, etc.). In an alternative embodiment, human intervention (e.g., manual intervention via an element management computer) is required to open and close each of the servo dampers of the system. Nevertheless, whether the modifications to the servo dampers occur with or without human intervention, the servo dampers may be quickly and easily adjusted to accommodate the needs of the individual components of the system, as well as the system as a whole.

An apparatus, such as the apparatus 100 of FIGS. 1 and 2, may be operated in different ways. Most embodiments of the disclosure, however, operate the one or more fan assemblies to move airflow into one of the first plenum or second plenum, over the one or more horizontal circuit boards and RTMs, and out of the second plenum or first plenum, respectively. In many embodiments, a front to back movement of the airflow is desired. Nevertheless, a back to front movement of the airflow is within the scope of the disclosure.

An apparatus, such as the apparatus 100 of FIGS. 1 and 2, has many advantages over similar existing structures. One such advantage is the availability of front to back or back to front cooling of the apparatus. As understood above, this feature is at least partially a function of the rotating of the circuit boards within the chassis, which ultimately forms a front plenum open to the front of the chassis and a back plenum open to the back of the chassis, with adequate airflow coupling to circuit board 120 and RTM 195. The apparatus additionally benefits as a result of fitting within existing frames, such as existing 23 inch or 600 mm frames, among others.

An apparatus, such as the apparatus 100 of FIGS. 1 and 2, may additionally benefit from a higher packing density of node boards. A node board, as discussed herein, includes a board that includes CPUs, I/O boards, signal processors, etc., as opposed to a central fabric board, which provides connectivity between the various node boards. Presently, in those configurations where more than three node boards are equipped in a traditional AdvancedTCA system, a central fabric board is required to interconnect them. Unfortunately, many desirable applications require four node boards (for example, two processors and two I/O boards). Traditional systems would equip this system in a six slot chassis, providing two fabric boards (active and redundant) to support the four node boards. This leads to high overhead cost per slot. In accordance with this disclosure, however, the four node boards could be included within a 3 U chassis, without the need for the multiple fabric boards.

Figure 3:
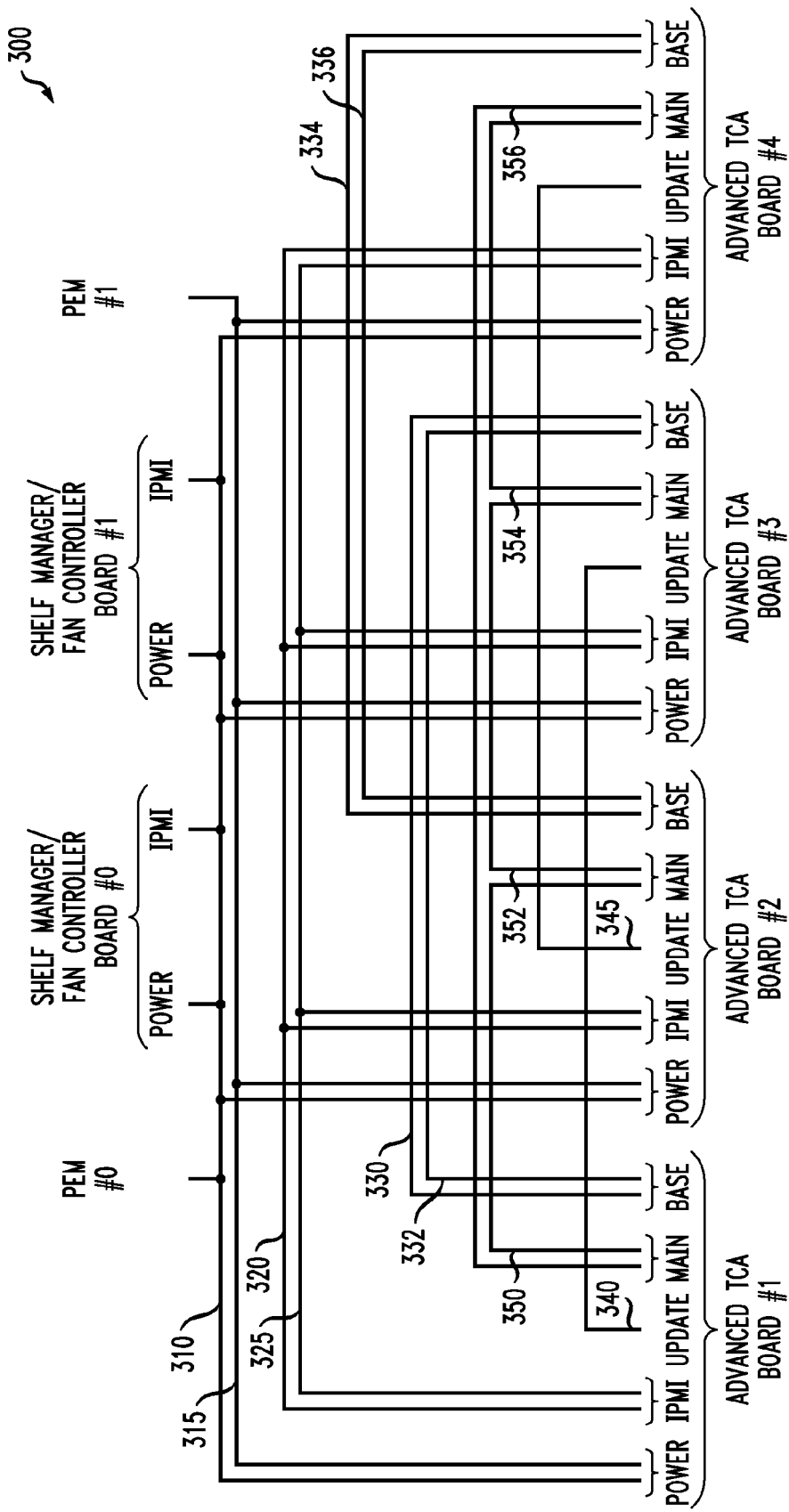
FIGS. 3 and 4 illustrate a topology of a backplane that provides full interconnect bandwidth between four boards without requiring a central fabric, in accordance with the disclosure.

FIG. 3 shows a topology of a backplane 300 that provides full interconnect bandwidth between four boards without requiring a central fabric, in accordance with the disclosure. In the example embodiment, five sets of interconnect resources are used on each node board. Redundant power busses 310, 315 connect both PEMs to all boards and shelf managers/fan controllers. Two intelligent platform management busses (also referred to as IPMB busses) 320, 325 interconnect the shelf manager functions to the board as a low speed hardware platform management infrastructure. The base interfaces 330, 332, 334, 336 interconnect the node boards as two pairs (1-3 and 2-4). For boards supporting update buses 340, 345, they follow the same topology as the base interfaces, but can provide more bandwidth. Finally the main fabric links 350, 352, 354, 356 provide up to 10 Gb/s point to point connectivity from each board to the two boards that are not in the pair served by the base/update connections.

Figure 4:
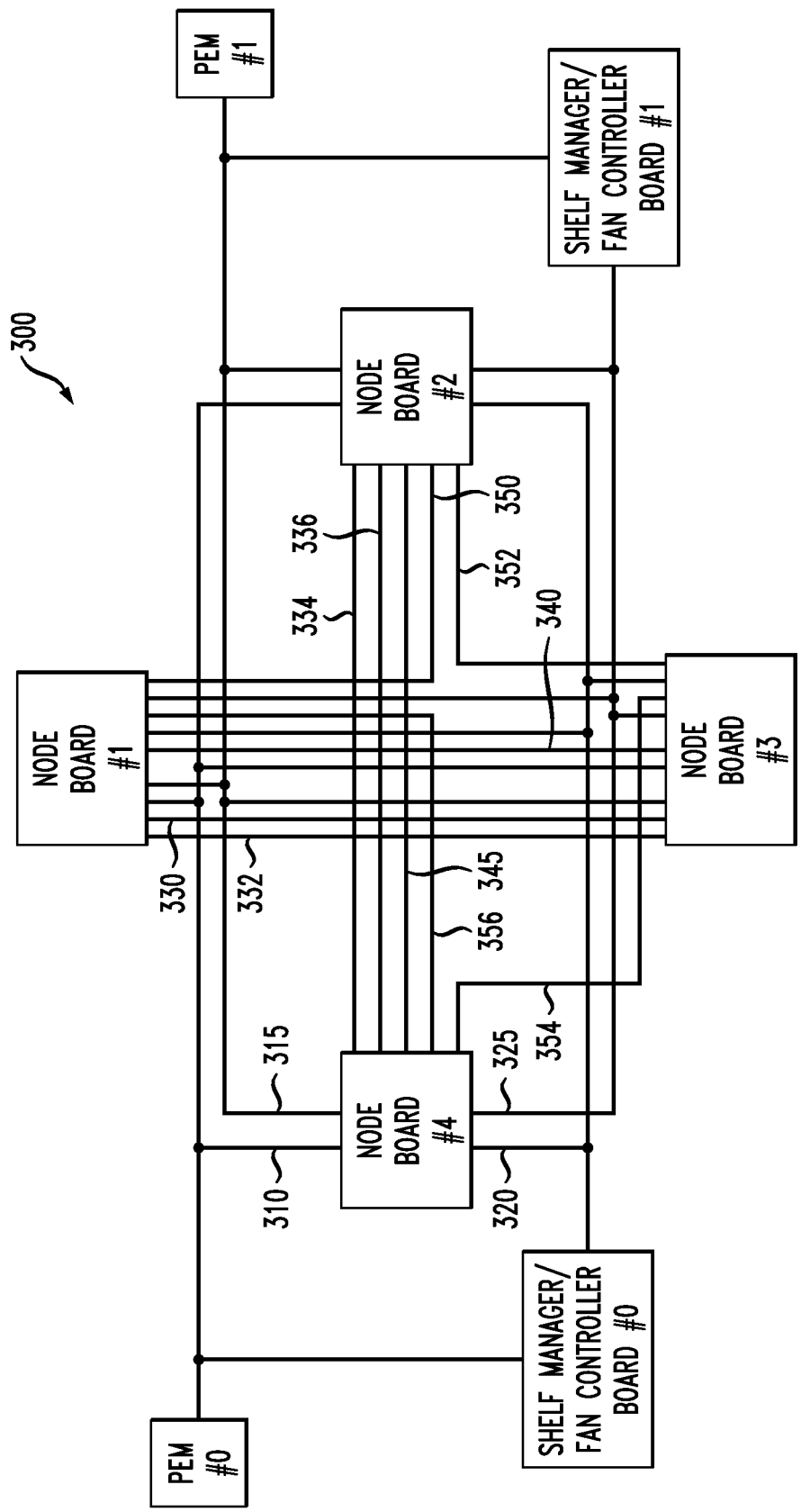

This topology can provide a minimum of 10 Gb/s from each board to the other three boards. If one board fails, the remaining three boards still each have a minimum of 10 Gb/s of bandwidth to the other two. This topology provides a backplane interconnect bandwidth equivalent to a fabric based interconnect, but without the cost of one or two (for redundancy) fabric boards. FIG. 4 illustrates another view of the topology discussed with respect to FIG. 3.

A configuration, such as that shown in FIGS. 3 and 4, is very space efficient, permitting four payload boards in only 3 U of frame space. This is much more efficient than any known horizontal chassis design, and somewhat better than most mainstream vertical AdvancedTCA chassis designs. Moreover, such a configuration does not require two expensive, power hungry central fabric boards, because all of the boards are interconnected using the backplane topology discussed above. Accordingly, its cost of common per slot can be 20-50% lower than today's popular designs, resulting in substantial system cost savings.

Figure 5:
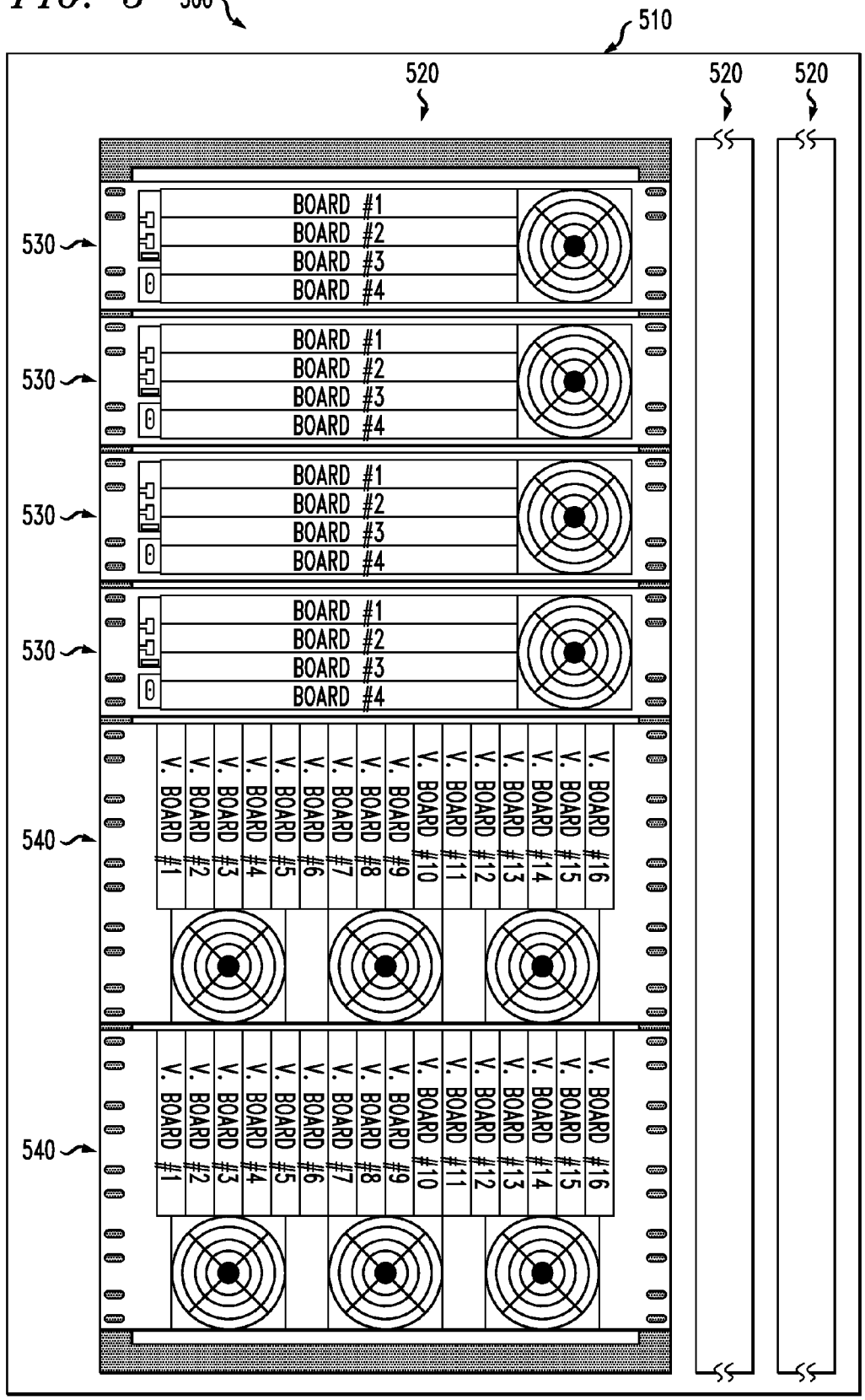
FIG. 5 illustrates a system manufactured in accordance with the disclosure.

FIG. 5 illustrates a system 500 in accordance with the disclosure. The system 500 of FIG. 5 includes an installation site 510 having a plurality of frames 520. The term installation site 510, as used herein, refers to a location where one or more frames 520 might be positioned. Accordingly, the installation site 510 might comprise a stand alone building (e.g., a telecom or datacom site) positioned at a desired location, or alternatively might comprise a room within a larger building (e.g., a server room). Accordingly, the installation site 510 should not be limited to any specific structure or location.

The frames 520 of FIG. 5 may be similar to any rack used in an electronics assembly, including a rack designed and manufactured in accordance with the 23 inch, 600 mm or ETSI standard. In the embodiment of FIG. 5, each frame 520, includes one or more horizontal apparatuses 530 and one or more vertical apparatuses 540. Nevertheless, other configurations exist wherein a frame 520 includes only the horizontal apparatuses 530 or the vertical apparatuses 540.

The horizontal apparatuses 530 of FIG. 5 are designed in accordance with this disclosure. In one embodiment, the horizontal apparatuses 530 of FIG. 5 are each similar to the apparatus 100 of FIGS. 1 and 2. Accordingly, in this embodiment, each horizontal apparatus 530 would include a horizontal chassis having a front, back and first and second sides. Each horizontal apparatus 530 might additionally have one or more horizontal slots located within the horizontal chassis. Additionally, each horizontal apparatus 530 might include one or more horizontal circuit boards located in associated ones of the one or more horizontal slots. In this embodiment, each horizontal slot positions one of the horizontal circuit boards at an angle with respect to the first and second sides, as discussed above. Moreover, the horizontal slots and horizontal circuit boards at least partially define a first plenum opening to the front of the horizontal chassis and a second plenum opening to the back of the horizontal chassis. Each horizontal apparatus 530 may additionally include a horizontal chassis fan assembly coupled to one of the first plenum or the second plenum. While one specific horizontal apparatus has been provided, those skilled in the art understand that other horizontal apparatuses may be used while staying within the purview of the disclosure.

Each vertical apparatus 540, on the other hand, includes a vertical chassis. Each vertical apparatus 540 may include one or more slots located within the vertical chassis, as well as one or more vertical circuit boards located within associated ones of the one or more vertical slots. Each vertical apparatus 540 may additionally include a vertical chassis fan assembly coupled to the vertical chassis. While one specific vertical apparatus has been provided, those skilled in the art understand that other vertical apparatuses may be used while staying within the purview of the disclosure.

In certain embodiments, each of the frames 520 is configured to move airflow from a front of the frames to the back of the frames, or vice versa. For example, in the embodiment of FIG. 5, the airflow is from front to back across each of the frames 520. The front to back airflow, such as that of FIG. 5, addresses one problem of prior art structures, for example problems caused when using side to side airflow.

The system 500 of FIG. 5 may include additional elements not shown. In one example embodiment, the system 500 includes a control subsystem. The control subsystem could be employed to control various aspects of the system 500, including controlling servo dampers, if used, in the horizontal and vertical apparatuses 530, 540. In another example embodiment, the system 500 includes an air control structure. The air control structure, in this embodiment, comprises an air conditioner configured to reduce the inside temperature of the installation site 510. In an alternative embodiment, the air control structure might comprise a fan configured to mix the warmer air within the installation site 510 and the cooler air surrounding the installation site 510. The air control structure should not be limited to any specific type or design.

The term "providing", as used in the context of this disclosure, means that the feature may be obtained from a party having already manufactured the feature, or alternatively may mean manufacturing the feature themselves and providing it for its intended purpose.

Although the present disclosure has been described in detail, those skilled in the art should understand that they can make various changes, substitutions and alterations herein without departing from the spirit and scope of the disclosure in its broadest form.

What is claimed is:

1. An apparatus, comprising:
 a chassis having a front configured to accept one or more circuit boards, a back, and a first side and a second side that are substantially perpendicular to the front and the back;
 one or more slots located within the chassis each slot having a leading front corner and a trailing back corner, each slot configured to receive one of the circuit boards at an angle with respect to the first and second sides, wherein the slots at least partially define a first plenum opening to the front proximate the leading front corner and a second plenum opening to the back proximate the trailing back corner; and
 a fan assembly coupled to one of the first plenum or the second plenum.

2. The apparatus of claim 1 wherein the fan assembly is a first fan assembly coupled to the first plenum, and further including a second fan assembly coupled to the second plenum.

3. The apparatus of claim 2 wherein the first fan assembly is located on the front of the chassis and the second fan assembly is located on the back of the chassis.

4. The apparatus of claim 3 wherein a first shelf manager is located on the front of the chassis distal the first fan assembly, and further wherein a second shelf manager is located on the back of the chassis distal the second fan assembly.

5. The apparatus of claim 3 wherein a first power entry module is located on the front of the chassis distal the first fan assembly, and further wherein a second power entry module is located on the back of the chassis distal the second fan assembly.

6. The apparatus of claim 2 wherein the first plenum is an intake plenum and the second plenum is an exhaust plenum.

7. The apparatus of claim 1 wherein the chassis is a 3U chassis supporting 4 slots and 4 RTMs.

8. The apparatus of claim 1 wherein the angle ranges from about 10 degrees to about 15 degrees.

9. The apparatus of claim 1 wherein the chassis is configured to attach to a 23 inch or 600 millimeter wide frame.

10. The apparatus of claim 1 wherein the chassis is configured to accept one or more horizontal circuit boards.

11. The apparatus of claim 1 including point to point interconnects on a backplane from each circuit board to all other circuit boards.

12. The apparatus of claim 11 wherein a subset of the interconnects are provided by base and update buses.

13. The apparatus of claim 12 wherein a different subset of the interconnects are provided by main fabric buses.

14. The apparatus of claim 13 wherein the backplane interconnect topology is a full mesh.

15. The apparatus of claim 1 wherein no central fabric boards are located within the chassis.

16. A system, comprising:
an installation site having a frame, the frame including:
a horizontal apparatus, including:
a horizontal chassis having a front, a back, and a first side and a second side that are substantially perpindicular to the front and the back;
one or more horizontal slots located within the horizontal chassis each horizontal slot having a leading front corner and a trailing back corner;
one or more horizontal circuit boards located in associated ones of the one or more horizontal slots, each horizontal slot positioning one of the horizontal circuit boards at an angle with respect to the first and second sides, wherein the horizontal slots and horizontal circuit boards at least partially define a first plenum opening to the front of the horizontal chassis proximate the leading front corner and a second plenum opening to the back of the horizontal chassis proximate the trailing back corner; and
a horizontal chassis fan assembly coupled to one of the first plenum or the second plenum; and
a vertical apparatus, including:
a vertical chassis;
one or more vertical slots located within the vertical chassis;
one or more vertical circuit boards located within associated ones of the one or more vertical slots; and
a vertical chassis fan assembly coupled to the vertical chassis.

17. The system of claim 16 wherein the horizontal chassis fan assembly is a first horizontal chassis fan assembly coupled to the first plenum, and further including a second horizontal chassis fan assembly coupled to the second plenum.

18. The system of claim 17 wherein the first horizontal chassis fan assembly is located on the front of the horizontal chassis, the second horizontal chassis fan assembly is located on the back of the horizontal chassis, and the vertical chassis fan assembly is located on a front of the vertical chassis.

19. The system of claim 18 wherein a first shelf manager is located on the front of the horizontal chassis distal the first horizontal chassis fan assembly, and further wherein a second shelf manager is located on the back of the horizontal chassis distal the second horizontal chassis fan assembly.

20. The system of claim 18 wherein a first power entry module is located on the front of the horizontal chassis distal the first horizontal chassis fan assembly, and further wherein a second power entry module is located on the back of the horizontal chassis distal the second horizontal chassis fan assembly.

21. The system of claim 16 wherein the angle ranges from about 10 degrees to about 15 degrees.

22. The system of claim 16 wherein the frame is a 23 inch or 600 millimeter wide frame.

23. The system of claim 16 wherein each of the horizontal apparatus and vertical apparatus are configured to move airflow from a front of the frame to a back of the frame.

24. The system of claim 16 wherein the frame is a first frame, and further including a second frame stacked proximate the first frame and including a second vertical apparatus and a second horizontal apparatus.

* * * * *